United States Patent
Jaw et al.

(10) Patent No.: US 9,179,550 B2
(45) Date of Patent: Nov. 3, 2015

(54) METHOD FOR MANUFACTURING TOUCH PANEL

(71) Applicant: ShenZhen Goldsun Network Intelligence Technology Co., Ltd., ShenZhen (CN)

(72) Inventors: Ten-Hsing Jaw, Zhubei (TW); Chin-Yang Wu, Zhubei (TW); Szu-Wei Sung, New Taipei (TW); Chiu-Chi Chen, Zhubei (TW)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 0 days.

(21) Appl. No.: 14/582,445

(22) Filed: Dec. 24, 2014

(65) Prior Publication Data

US 2015/0181715 A1    Jun. 25, 2015

(30) Foreign Application Priority Data

Dec. 25, 2013  (TW) .............................. 102148134 A

(51) Int. Cl.
| | | |
|---|---|---|
| *G06F 3/041* | (2006.01) | |
| *H05K 3/00* | (2006.01) | |
| *G06F 3/042* | (2006.01) | |
| *H01L 27/12* | (2006.01) | |

(52) U.S. Cl.
CPC *H05K 3/00* (2013.01); *G06F 3/041* (2013.01); *G06F 3/042* (2013.01); *H01L 27/1255* (2013.01); *H05K 2203/308* (2013.01)

(58) Field of Classification Search
CPC .... H05K 3/00; H05K 2203/308; G06F 3/041; G06F 3/042; G06F 3/043; H01L 27/1255
USPC .......................................... 257/435; 345/173
See application file for complete search history.

(56) References Cited

U.S. PATENT DOCUMENTS

| | | | | |
|---|---|---|---|---|
| 2013/0155011 A1* | 6/2013 | Kim et al. | ...................... | 345/174 |
| 2013/0162565 A1* | 6/2013 | Kim et al. | ...................... | 345/173 |
| 2013/0181937 A1* | 7/2013 | Chen et al. | ..................... | 345/174 |
| 2013/0187872 A1* | 7/2013 | Kurashima | .................... | 345/173 |
| 2013/0194204 A1* | 8/2013 | Kang et al. | ...................... | 345/173 |
| 2013/0194220 A1* | 8/2013 | Lee et al. | ....................... | 345/173 |
| 2013/0201116 A1* | 8/2013 | Huang | .......................... | 345/173 |
| 2013/0201122 A1* | 8/2013 | Kurashima et al. | ........... | 345/173 |
| 2013/0201348 A1* | 8/2013 | Li et al. | .......................... | 348/174 |
| 2013/0215082 A1* | 8/2013 | Mi | ................................ | 345/174 |
| 2015/0160747 A1* | 6/2015 | Kohara et al. | ................. | 345/173 |

\* cited by examiner

*Primary Examiner* — Nathan Ha
(74) *Attorney, Agent, or Firm* — Novak Druce Connolly Bove + Quigg LLP

(57) ABSTRACT

A method for manufacturing a touch panel includes the following procedures. A first conductive layer and a shielding layer surrounding the first conductive layer are formed on a base plate. The first conductive layer is etched to form a plurality of first and second sensing pads alternatively arranged according to columns. The first sensing pads in a column along a first direction are electrically coupled to each other to form a first sensing electrode column. The second sensing pads in a column along a second direction are electrically coupled to each other to form a second sensing electrode column. A second conductive layer is formed on the shielding layer via an ink jet printing method, and is etched to form a plurality of first and second sensing lines to be respectively electrically coupled to the first and second sensing electrode columns.

14 Claims, 7 Drawing Sheets

METHOD FOR MANUFACTURING TOUCH PANEL

FIELD

The subject matter herein generally relates to a method for manufacturing a touch panel, and in particular to a method for manufacturing a touch panel with a single conductive layer.

BACKGROUND

Touch panels are input devices that allow manual instruction to be input by touching the screen.

BRIEF DESCRIPTION OF THE DRAWINGS

Implementations of the present technology will now be described, by way of example only, with reference to the attached figures.

DETAILED DESCRIPTION

Figure 1:
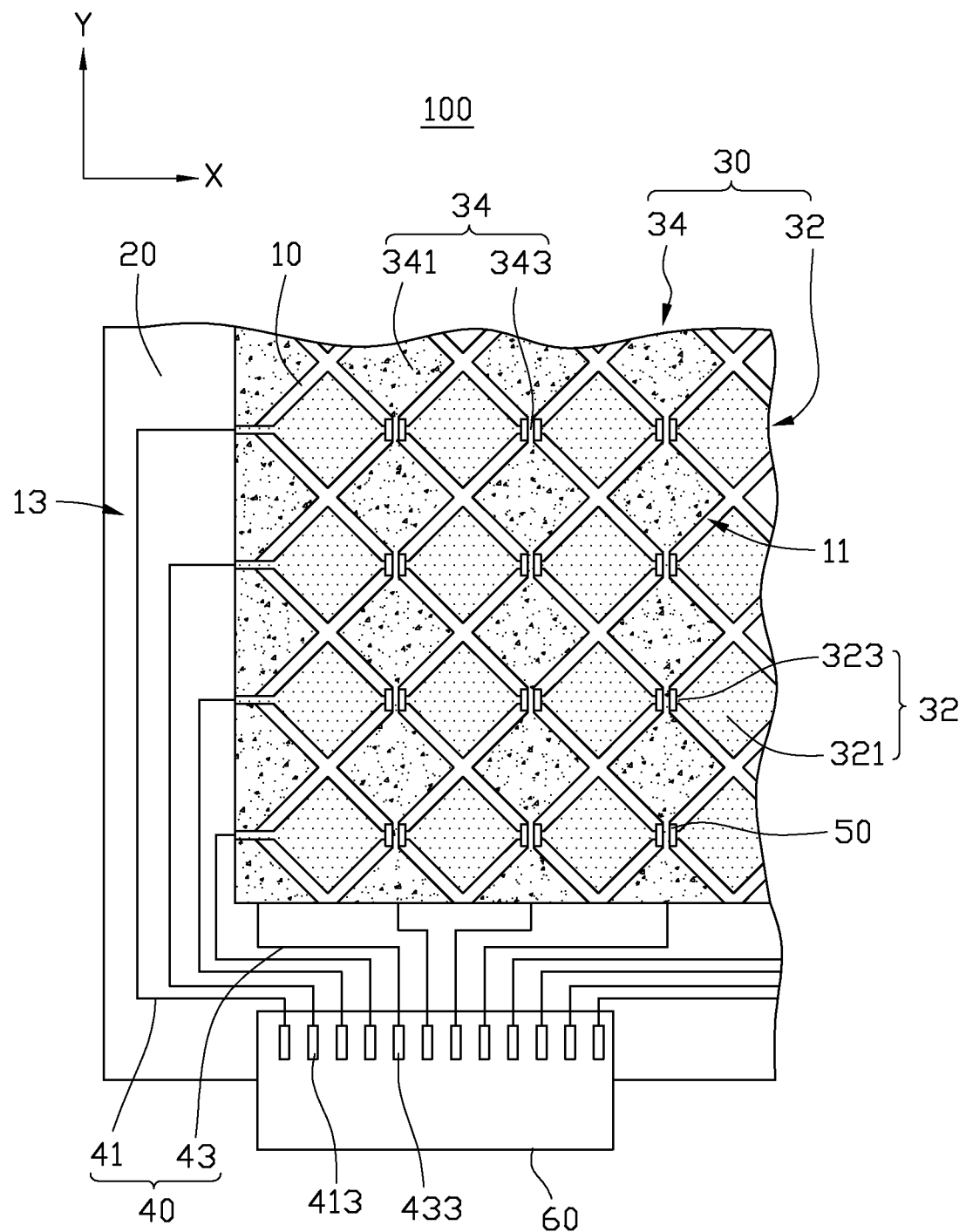
FIG. 1 is a top plan view of an embodiment of a part of a touch panel.
Figure 2:
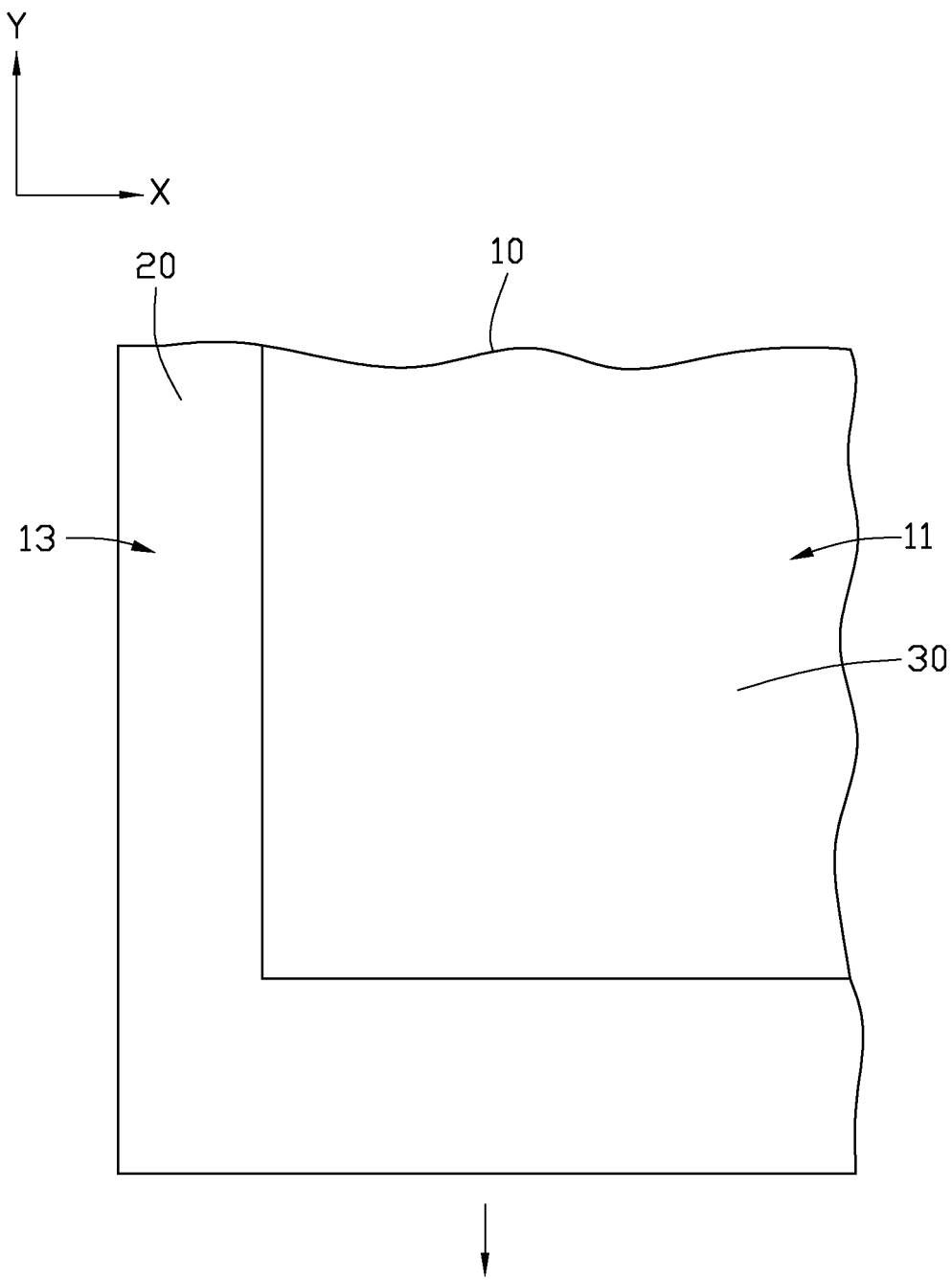
FIG. 2 illustrates a top view according to one example of a process for manufacturing the touch panel of FIG. 1.
Figure 3:
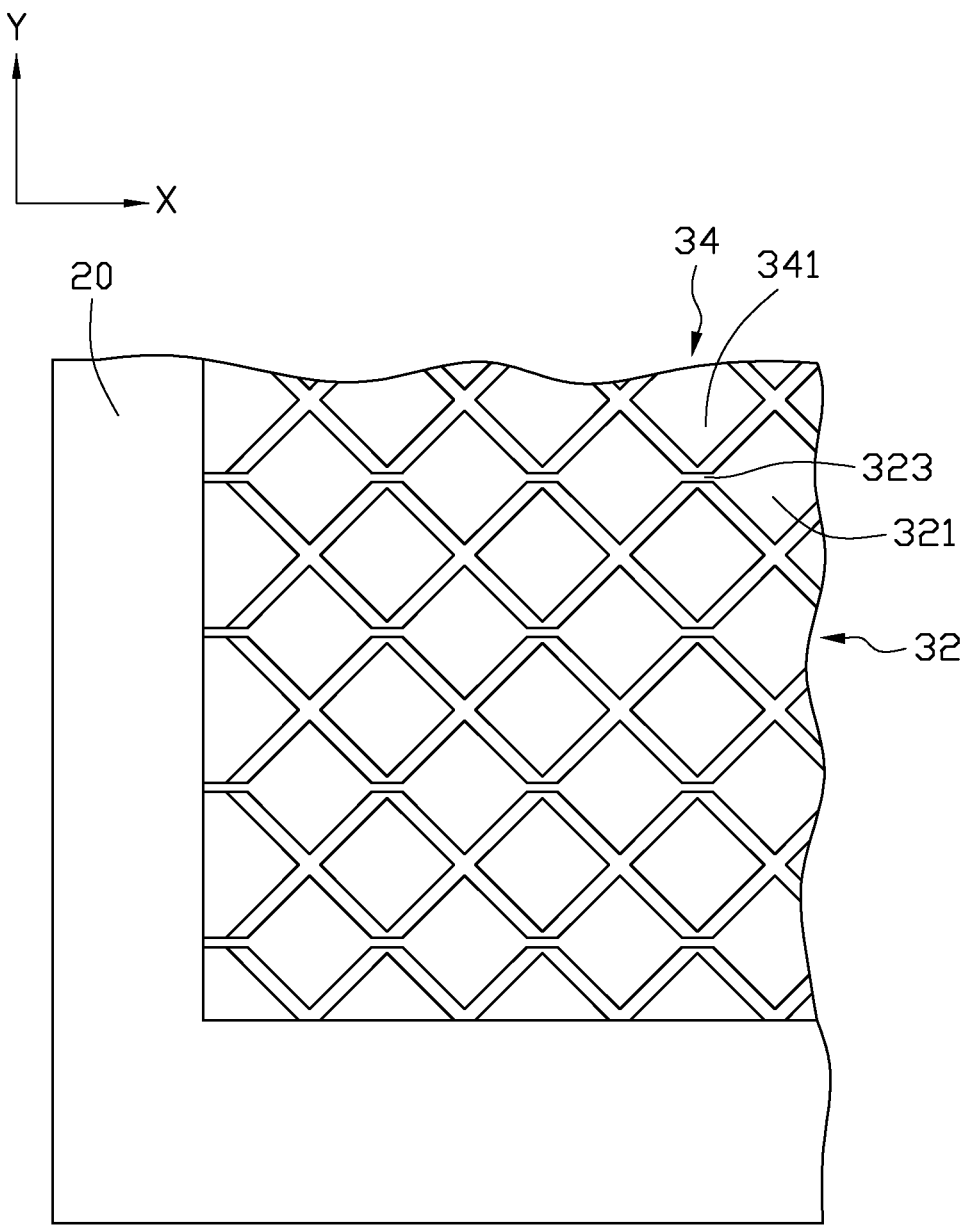
FIG. 3 illustrates a top view according to another example of a process for manufacturing the touch panel of FIG. 1.
Figure 4:
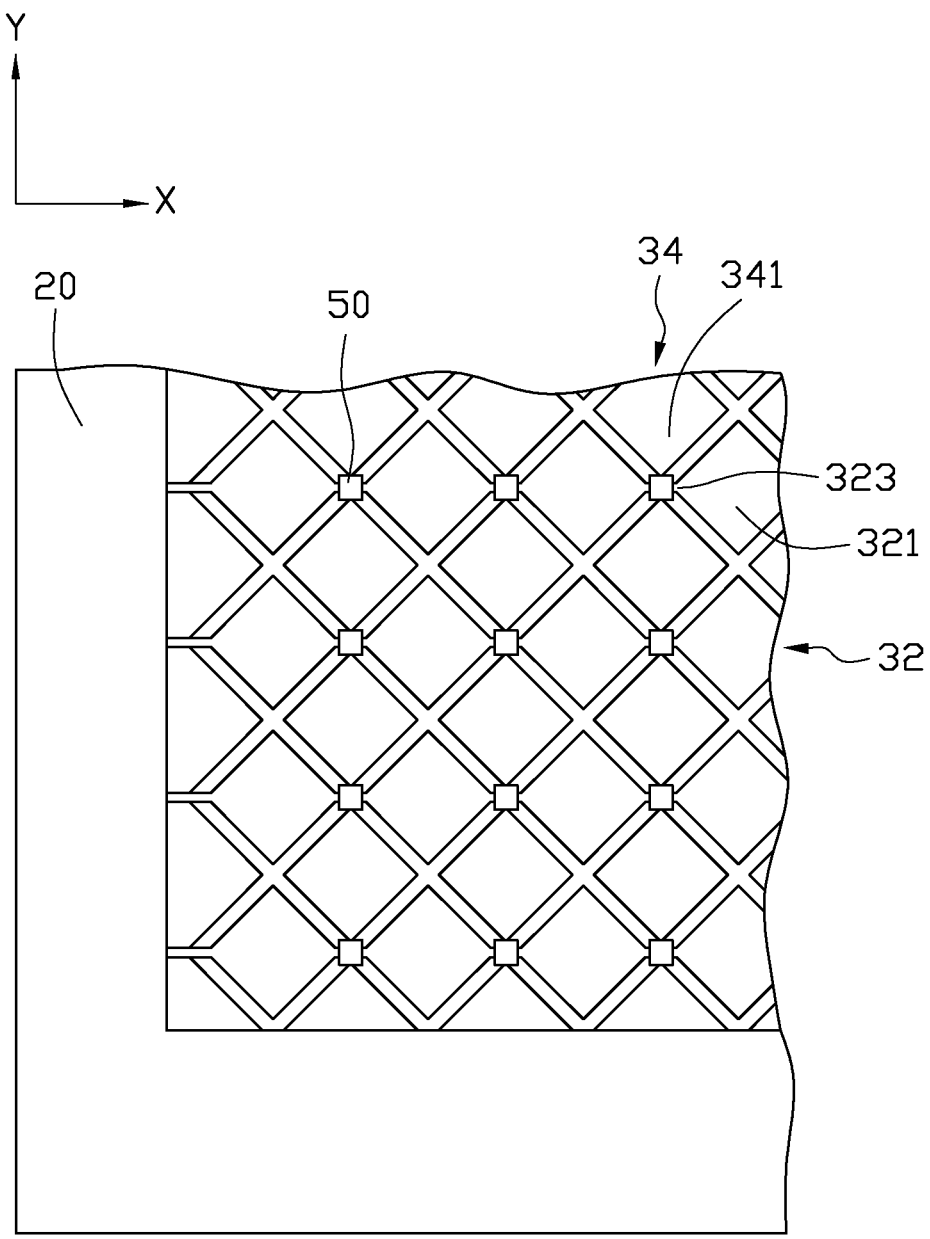
FIG. 4 illustrates a top view according to yet another example of a process for manufacturing the touch panel of FIG. 1.
Figure 5:
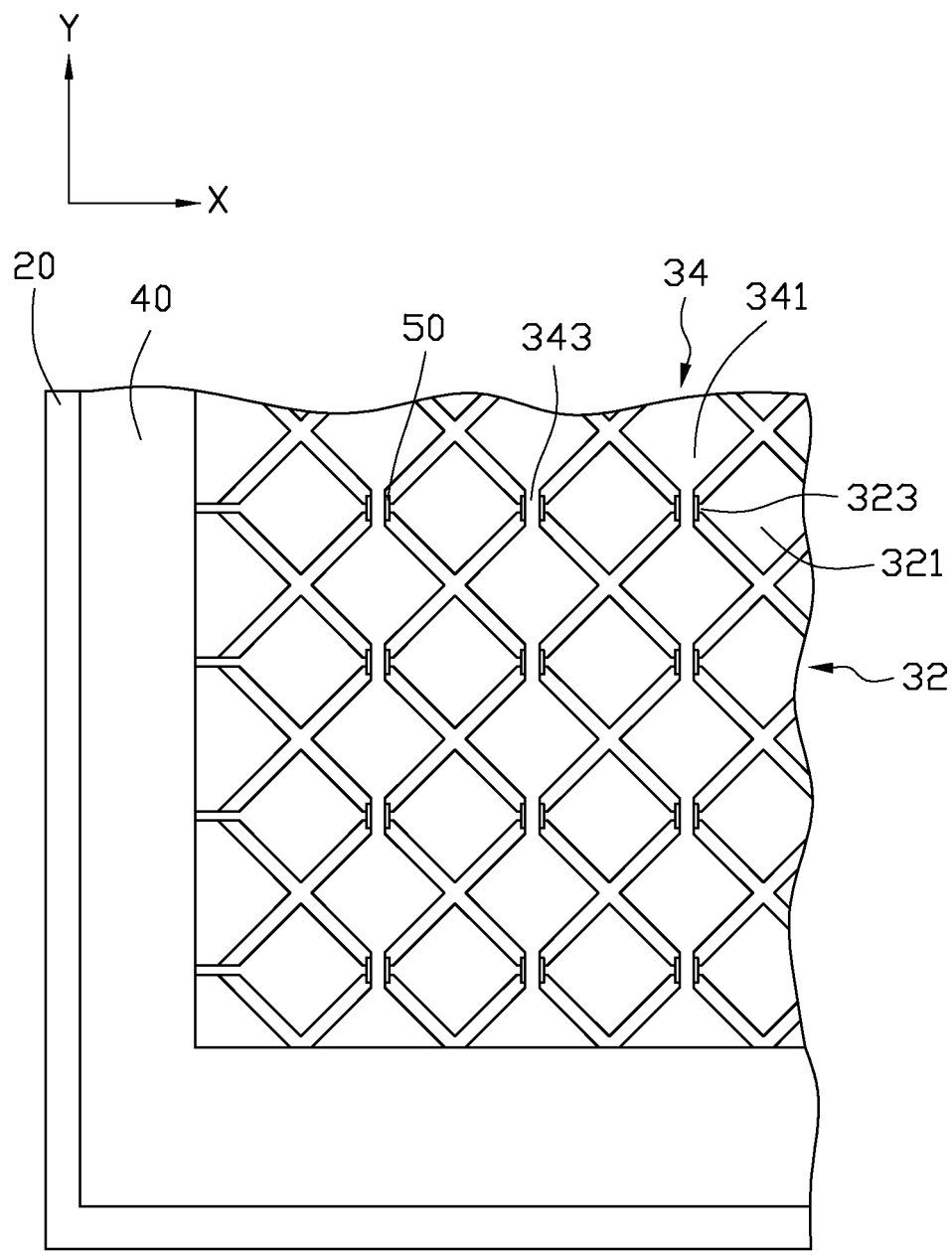
FIG. 5 illustrates a top view according to still another example of a process for manufacturing the touch panel of FIG. 1.
Figure 6:
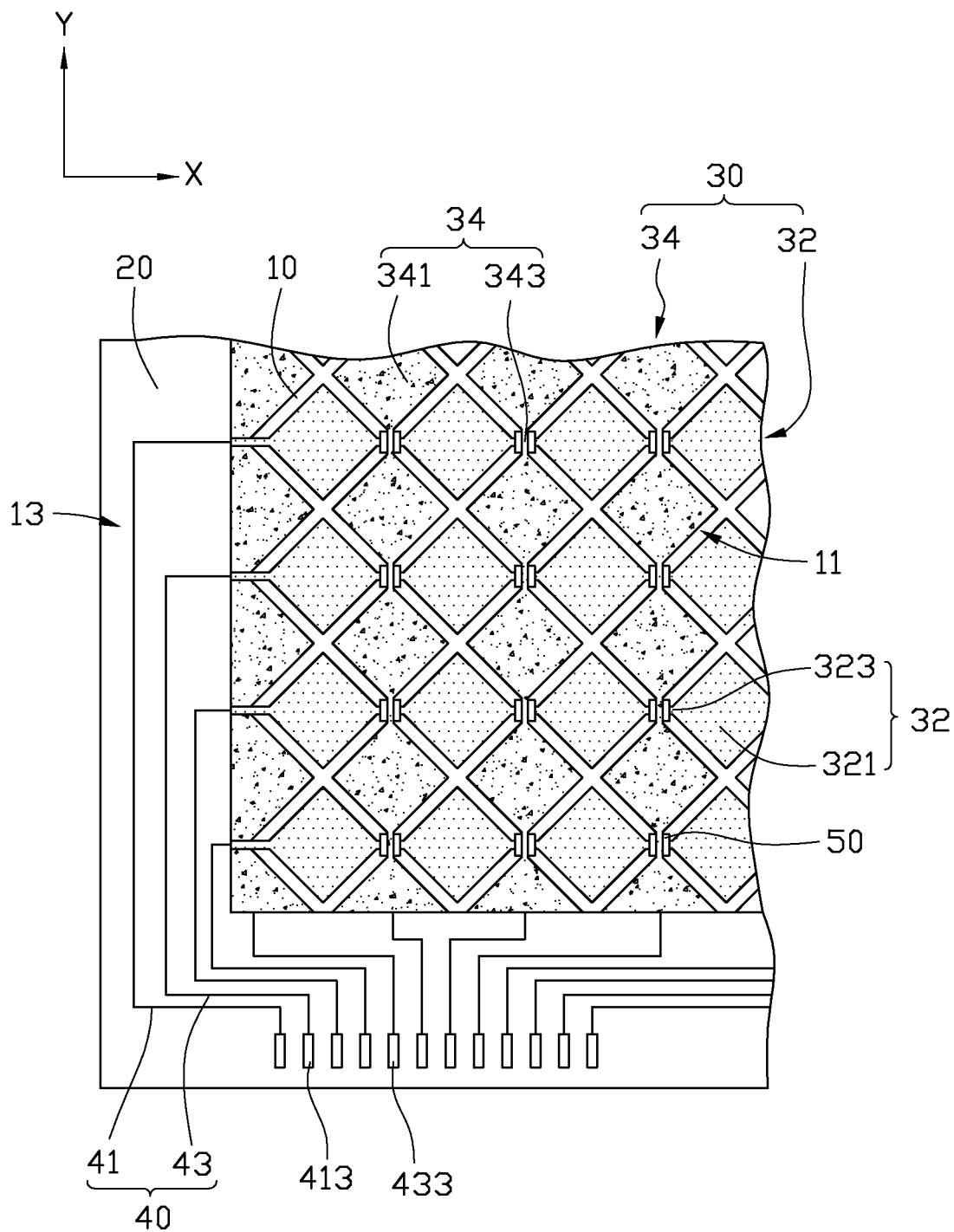
FIG. 6 illustrates a top view according to one example of a process for manufacturing the touch panel of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

A method for manufacturing a touch panel can include: providing a base plate; forming a first conductive layer and a shielding layer surrounding the first conductive layer on the base plate to substantially completely cover the base plate; etching the first conductive layer to form a plurality of first sensing pads which are arranged according to columns along a first direction, the first sensing pads arranged in a column along the first direction being electrically coupled to each other to form a first sensing electrode column; etching the first conductive layer to form a plurality of second sensing pads which are arranged according to columns along a second direction intersecting the first direction, and forming one bridge connector between each two neighboring second sensing pads in a column along the second direction, the second sensing pads arranged in each column according the second direction having separate patterns and being electrically coupled to each other via the bridge connectors to form a second sensing electrode column; forming a second conductive layer on the shielding layer via an ink jet printing method, the second conductive layer at least partially covering the shielding layer; and etching the second conductive layer to form a plurality of first and second sensing lines separated from each other via a laser processing method, each first sensing line being electrically coupled to the corresponding one first sensing electrode column, and each second sensing line being electrically coupled to the corresponding one second sensing electrode column.

FIG. 1 illustrates an embodiment of a touch panel 100. The touch panel 100 can include a base plate 10, a shielding layer 20, a first conductive layer 30, a second conductive layer 40, and a flexible printed circuit board (FPCB) 60. The base plate 10 can include a display portion 11, and a non-display portion 13 surrounding the display portion 11. The shielding layer 20 can be formed on the non-display portion 13 to cover the non-display portion 13. The first conductive layer 30 can be formed on the display portion 11, and the edge of the first conductive layer 30 can overlap the edge of the shielding layer 20, thus the conductive layer 30 and the shielding layer 20 can completely cover the base plate 10. The second conductive layer 40 can be formed on the shielding layer 20, and be electrically coupled to the first conductive layer 30. The FPCB 60 can be positioned adjacent to a side of the base plate 10 and electrically coupled to the second conductive layer 40. In at least one embodiment, the first conductive layer 30 cannot overlap the shielding layer 20, so long as the conductive layer 30 and the shielding layer 20 can completely cover the base plate 10.

The base plate 10 can be made of transparent insulation materials, such as transparent glass, quartz, or organic polymers. The shielding layer 20 can be made of black resin. In at least one embodiment, the material of the shielding layer 20 can be changed as needed.

The first conductive layer 30 can include a number of first sensing electrode columns 32 and a number of second sensing electrode columns 34 arranged as a matrix. The first sensing electrode columns 32 can intersect, and be insulated from the second sensing electrode columns 34. The first sensing electrode columns 32 can be arranged along a first direction X. Each first sensing electrode column 32 can include a number of first sensing pads 321 and a number of connecting wires 323. The first sensing pads 321 and the connecting wires 323 can be alternatively arranged along the first direction X and electrically coupled to each other in order. The second sensing electrode columns 34 can be arranged along a second direction Y which intersects the first direction X, and each second sensing electrode column 34 can include a number of second sensing pads 341 and a number of bridge connectors 343 which are alternatively arranged along the second direction Y and electrically coupled to each other in order. A number of insulated layers 50 can be sandwiched between the connecting wires 323 and the bridge connectors 343, and each insulated layer 50 can be positioned on an intersectional portion of one connecting wire 323 and the corresponding one bridge connector 343.

The first conductive layer 30 can be made of transparent conduction materials, such as indium tin oxide (ITO) or indium zinc oxide (IZO). The insulated layer 50 can be made of transparent organic materials, which are thermosetting or UV-curing, such as poly (4 vinyl phenol), polyimide, aromatic ether, or aromatic hydrocarbon, for example. In at least one embodiment, the first conductive layer 30 can be made of metal, such as gold, silver, copper, aluminum, or molybdenum.

The shape of the second conductive layer 40 can be substantially a sector. The second conductive layer 40 can include a number of first sensing lines 41 and a number of second sensing lines 43 separated from the first sensing lines 41. The first sensing lines 41 can be electrically coupled to the first sensing electrode columns 32, respectively. Each first sensing line 41 can define a first connecting pad 413 on an end away from the corresponding first sensing electrode column 32. The second sensing lines 43 can be electrically coupled to the second sensing electrode columns 34, respectively. Each second sensing line 43 can define a second connecting pad 433 on an end away from the corresponding second sensing electrode column 34. The number of first connecting pads 413 and the number of second connecting pads 433 can be located on a same side of the base plate 10. In at least one embodiment, the first sensing lines 41 and the second sensing lines 43 can be made of materials with excellent conductivity, such as metal.

The FPCB 60 can be coated on, and electrically coupled to the first connecting pads 413 and the second connecting pads 433, thus the FPCB 60 can be electrically coupled to the first sensing electrode columns 32 and the second sensing electrode columns 34 via the first sensing lines 41 and the second sensing lines 43.

Figure 7:
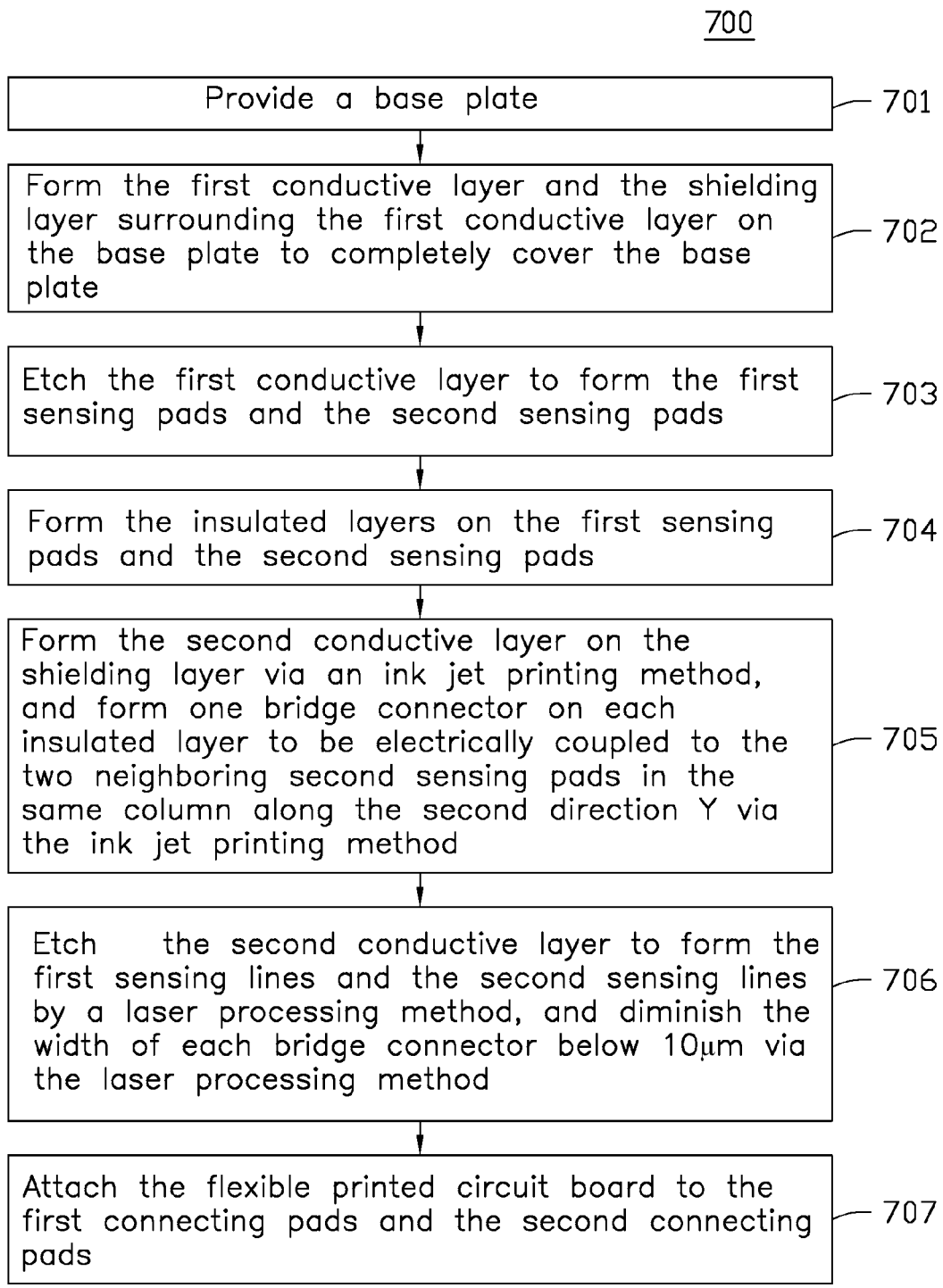
FIG. 7 is a flowchart for manufacturing the touch panel of FIG. 1.

FIGS. 2 to 7 illustrate the process and method for manufacturing the touch panel in accordance with an example embodiment. Referring to FIG. 7, a flow chart is presented in accordance with an example embodiment. The method 700 is provided by way of example, as there are a variety of ways to carry out the method. The method 700 described below can be carried out using the configurations illustrated in FIGS. 2-6, for example, and various elements of these figures are referenced in explaining example method 700. Each block shown in FIG. 7 represents one or more processes, methods or subroutines, carried out in the example method 700. Furthermore, the illustrated order of blocks is by example only and the order of the blocks can change according to the present disclosure. Additional blocks may be added or fewer blocks may be utilized, without departing from this disclosure. The example method 700 for manufacturing the touch panel can begin at block 701.

At block 701, a base plate is provided. In at least one embodiment, the base plate 10 can be made of transparent insulation materials, such as transparent glass, quartz, or organic polymers.

At block 702, the first conductive layer and the shielding layer are formed together on the base plate to cover the base plate, and the shielding layer surrounds the first conductive layer.

In at least one embodiment, the first conductive layer 30 can be coated on the display portion 11 of the base plate 10 by a sputtering coating method, the shielding layer 20 can be formed on and cover the non-display portion 13. The shielding layer 20 can be made of black resin.

At block 703, the first sensing pads and the second sensing pads are formed via etching the first conductive layer.

The first sensing pads 321 and the second sensing pads 341 can be arranged as a matrix, insulated from each other, and alternatively arranged according to columns. The connecting wires 323 can be formed via etching parts of the first conductive layer 30 located between each two adjacent first sensing pads 321 in the same column along the first direction X, thus the first sensing pads 321 in the same column along the first direction X can be electrically coupled to each other via the first connecting wires 323. The first sensing pads 321 in the same column along the second direction Y can be insulated from each other. The second sensing pads 341 in the same column along the second direction Y can be formed in separate patterns, thus the second sensing pads 341 can be insulated from each other.

At block 704, the insulated layers are patterned on the first sensing pads and the second sensing pads.

Each insulated layer 50 can be located on a portion of each two neighboring second sensing pads 341 in a column along the second direction Y, and a portion of each two first sensing pads 321 positioned adjacent to the two neighboring second sensing pads 341. The insulated layers 50 can be formed via an ink jet printing method. In at least one embodiment, the insulated layers 50 can be attached to the first sensing pads 32 and the second sensing pads 34.

At block 705, the second conductive layer is formed on the shielding layer via an ink jet printing method, and one bridge connector is formed on each insulated layer and electrically coupled to the two neighboring second sensing pads in the same column along the second direction Y via the ink jet printing method.

The second conductive layer 40 and the bridge connectors 343 can both be composed conductive nanoparticles of ink doped with silver. The second conductive layer 40 can be substantially fan-shaped, and can cover the shielding layer 20, and the width of each bridge connector 343 can be about 30 μm to 50 μm. In at least one embodiment, the second conductive layer 40, and the bridge connectors 343 can be made of ink doped with gold or copper nanoparticles. In at least one embodiment, the bridge connectors 343 can be formed after the step of forming the second conductive. In at least one embodiment, the step of forming the bridge connectors 343 can be omitted, and the bridge connectors 343 can be made of metal wires covered with insulated film to directly interconnect with each two neighboring second sensing pads 341.

At block 706, the first sensing lines and the second sensing lines are formed via etching the second conductive layer by a laser processing method and the width of each bridge connector is reduced below 10 μm via the laser processing method.

The first sensing lines 41 can be separated from the second sensing lines 43 to provide an insulation property. The first sensing lines 41 can be spaced a predetermined distance from each other to provide an insulation property. The second sensing lines 43 can be spaced a predetermined distance from each other to provide an insulation property. Each first sensing line 41 can be coupled to the corresponding first sensing pads 321 in a same column. Each second sensing line 43 can be coupled to the corresponding second sensing pads 341 in a same column. A laser device (not shown) can emit laser beams to parts of the second conductive layer 40 and the edge of each bridge connector 343. When a power density of the laser beams is more than a threshold power density of the second conductive layer 40, the parts of the second conductive layer 40 can be vaporized by the laser beams. In this way, the first sensing lines 41 and the second sensing lines 43 can be formed, and the width of each conductive connector 70 can be reduced. The laser device can emit continuous laser beams to form the first sensing lines 41 and the second sensing lines 43, and to diminish the widths of the conductive connectors 70, and the wave length of the laser can be about 1064 nanometers. In at least one embodiment, the laser device can emit pulse laser beams to form the first sensing lines 41 and the second sensing lines 43, and diminish the widths of the conductive connectors 70, and the wave length of the laser is not limited to above.

At block 707, the flexible printed circuit board is attached to the first connecting pads of the first sensing lines and the second connecting pads of the second sensing lines.

In at least one embodiment, the method can include a curing step after forming the first conductive layer 30, forming the insulated layer 50, forming the bridge connectors 343, or forming the second conductive layer 40, respectively. The corresponding film can be cured by one or more methods selected from the group consisting of room temperature curing, high temperature curing, and ultraviolet curing.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure, as defined by the appended claims.

What is claimed is:

1. A method for manufacturing a touch panel, the method comprising:
   providing a base plate;
   forming a first conductive layer and a shielding layer surrounding the first conductive layer on the base plate to substantially completely cover the base plate;
   etching the first conductive layer to form a plurality of first sensing pads which are arranged according to columns along a first direction, the first sensing pads arranged in a column along the first direction being electrically coupled to each other to form a first sensing electrode column;
   etching the first conductive layer to form a plurality of second sensing pads which are arranged according to columns along a second direction intersecting the first direction, and forming one bridge connector between each two neighboring second sensing pads in a column along the second direction, the second sensing pads arranged in each column according the second direction having separate patterns and being electrically coupled to each other via the bridge connectors to form a second sensing electrode column;
   forming a second conductive layer on the shielding layer via an ink jet printing method, the second conductive layer at least partially covering the shielding layer; and
   etching the second conductive layer to form a plurality of first and second sensing lines separated from each other via a laser processing method, each first sensing line being electrically coupled to the corresponding one first sensing electrode column, and each second sensing line being electrically coupled to the corresponding one second sensing electrode column.

2. The method of claim 1, further comprising a step before the step of forming the bridge connectors: forming a plurality of insulated layers on the plurality of first and second sensing pads, each insulated layer overlapping a portion of each two neighboring second sensing pads arranged in a column along the second direction and a portion of each two first sensing pads positioned adjacent to the two neighboring sensing pads, and the bridge connectors are formed on the plurality of insulated layers.

3. The method of claim 2, wherein the plurality of insulated layers are formed by the ink jet printing method.

4. The method of claim 2, wherein the bridge connectors are formed by the ink jet method, and the width of each conductive connector after the step of forming the conductive connectors is in a range from about 30 µm to about 50 µm.

5. The method of claim 4, further comprising a step during the step of forming the plurality of first and second sensing lines, the step comprising: diminishing the widths of the plurality of edge connectors below 10 µm via the laser processing method.

6. The method of claim 1, wherein continuous laser beams are employed in the step of forming the plurality of first and second sensing lines to form the plurality of first and second sensing lines.

7. The method of claim 1, wherein plus laser beams are employed in the step of forming the plurality of first and second sensing lines to form the plurality of first and second sensing lines.

8. The method of claim 1, wherein a laser with a wave length of 1064 nanometers is employed in the step of forming the plurality of first and second sensing lines to form the plurality of first and second sensing lines.

9. The method of claim 1, further comprising a step after the step of forming the first conductive layer, the step comprising: solidifying the first conductive layer.

10. The method of claim 9, wherein the first conductive layer is solidified by one or more methods selected from the group consisting of a method of room temperature curing, a method of high temperature curing, and a method of ultraviolet curing.

11. The method of claim 1, further comprising a step after the step of forming the second conductive layer, the step comprising: solidifying the second conductive layer.

12. The method of claim 11, wherein the second conductive layer is solidified by one or more methods selected from the group consisting of a method of room temperature curing, a method of high temperature curing, and a method of ultraviolet curing.

13. The method of claim 1, wherein the second conductive layer is made of one or more materials selected from the group consisting of ink doped with silver nanoparticles, ink doped with gold nanoparticles, and ink doped with copper nanoparticles.

14. The method of claim 1, wherein the first conductive layer is formed by a sputtering coating method.

* * * * *